United States Patent
Wu

(10) Patent No.: US 8,347,193 B2
(45) Date of Patent: Jan. 1, 2013

(54) PARALLEL INVERSIONLESS ERROR AND ERASURE PROCESSING

(75) Inventor: Yingquan Wu, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 199 days.

(21) Appl. No.: 12/960,094

(22) Filed: Dec. 3, 2010

(65) Prior Publication Data

US 2011/0078543 A1    Mar. 31, 2011

Related U.S. Application Data

(63) Continuation of application No. 11/706,068, filed on Feb. 12, 2007, now Pat. No. 7,780,469.

(51) Int. Cl.
 *H03M 13/00*  (2006.01)
(52) U.S. Cl. .................................................. 714/784
(58) Field of Classification Search .............. 714/781, 714/784–786
See application file for complete search history.

(56) References Cited

U.S. PATENT DOCUMENTS

| | | | | |
|---|---|---|---|---|
| 6,119,262 A | * | 9/2000 | Chang et al. | 714/781 |
| 7,010,739 B1 | * | 3/2006 | Feng et al. | 714/784 |
| 7,249,310 B1 | * | 7/2007 | Feng et al. | 714/784 |
| 2008/0276156 A1 | | 11/2008 | Gunnam et al. | |
| 2008/0301521 A1 | | 12/2008 | Gunnam et al. | |

OTHER PUBLICATIONS

Seth et al., Ultra folded high speed architectures for Reed Solomon decoders, 2006, IEEE, p. 1 to 4.*
Xu, Youzhi, Implementation of Berlekamo-Massey algorithm without inversion, Jun. 1991, IEEE proceeding-I, vol. 138, No. 3, p. 138-140.*
Troung et al., A new decoding algorithm for correcting both earsures and errors of Reed Solomon codes, Mar. 2003, IEEE Trans. on Comm. vol. 51, No. 3, p. 381-388.*
Chang et al., A (208,192;8) Reed Solomon decoder for DVDE application, 1998, IEEE, p. 957-960.*
Zhang et al., A high speed low complexity Reed solomon decoder for correcting errors and erasures, 2-5, IEEE, p. 976-979.*
Rashid et al., A low complexity, high speed, regular and flexible reed solomon decoder for wireless communication, 2005, IEEE, p. 1-6.*

* cited by examiner

*Primary Examiner* — Shelly A Chase
(74) *Attorney, Agent, or Firm* — Van Pelt, Yi & James LLP

(57) ABSTRACT

A complementary error evaluator polynomial is generated by obtaining a syndrome polynomial and one or more erasure locations. The syndrome polynomial and the erasure locations are associated with Reed-Solomon encoded information. A complementary error evaluator polynomial and an error locator polynomial are simultaneously generated using the syndrome polynomial and the erasure locations where the complementary error evaluator polynomial is a complement of the error evaluator polynomial.

21 Claims, 2 Drawing Sheets

US 8,347,193 B2

PARALLEL INVERSIONLESS ERROR AND ERASURE PROCESSING

CROSS REFERENCE TO OTHER APPLICATIONS

This application is a continuation of U.S. patent application Ser. No. 11/706,068 (now U.S. Pat. No. 7,870,469), entitled PARALLEL INVERSIONLESS ERROR AND ERASURE PROCESSING filed Feb. 12, 2007 which is incorporated herein by reference for all purposes.

BACKGROUND OF THE INVENTION

Reed-Solomon codes are used in a wide variety of applications, such as in disk drive systems. For example, when Reed-Solomon encoded data is read back from a disk or other storage media, error and erasure processing is applied to the data that is read. One type of approach is to divide up erasure and error processing by first removing the erasures and then performing error-only decoding. Another approach is to handle or otherwise process errors and erasures in a unified manner or otherwise together, rather than in separate processes or steps. It would be desirable to develop new techniques that are related to the second approach where errors and erasure are processed in a unified manner. For example, it would be desirable if new techniques and/or systems were developed that have improved critical path.

BRIEF DESCRIPTION OF THE DRAWINGS

Various embodiments of the invention are disclosed in the following detailed description and the accompanying drawings.

DETAILED DESCRIPTION

Figure 1:
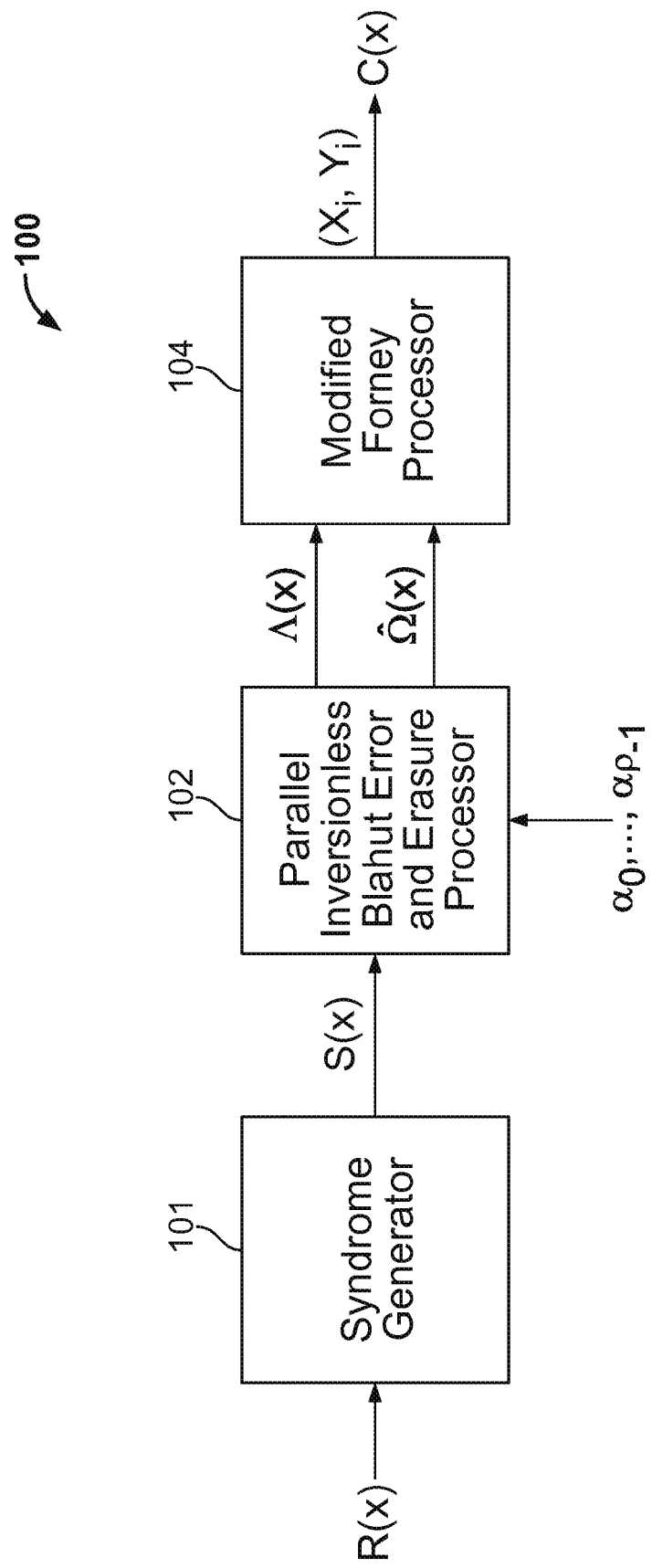
FIG. 1 is a diagram illustrating an embodiment of a decoder configured to process Reed-Solomon encoded data.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Blahut's error and erasure algorithm (described in *Algebraic Codes for Data Transmission* by R. E. Blahut, 2003, hereinafter referred to as Blahut's book) includes the iterative computation of discrepancies ($\Delta$ in Blahut's book; referred to as $\hat{\Omega}_0^{(r)}$ herein) followed by an update of the error locator polynomial. The critical path in Blahut's book includes two multipliers, $2+\lceil \log_2 t \rceil$ adders, and one multiplexer. What is disclosed is an error and erasure decoding process for Reed-Solomon codes in which a complement of an error evaluator polynomial and an error locator polynomial are updated simultaneously so that the discrepancy computation is not needed. In some embodiments, the critical path passes through only one multiplier, one adder and one multiplexer. In some embodiments, a related systolic architecture uses $8t+2$ multipliers and $8t+2$ registers, compared to some other non-systolic architectures associated with other techniques that use $6t+2$ multipliers and $4t+2$ registers.

In some embodiments, a systolic architecture has the following characteristics: a massive and non-centralized parallelism, local communication, and/or synchronous evaluation. For example, a systolic architecture may be a network of interconnected processing units where only the processors at the border of the architecture can communicate outside. The task of one cell can be summarized as: receive-compute-transmit.

Reed-Solomon codes are some of the most commonly used error correction codes in practice. Some of their widespread applications include magnetic and optical data storage, wireline and wireless communications, and satellite communications. A Reed-Solomon code (n, k) over a finite field GF(q) satisfies $n < q$ and achieves the maximally separable distance, i.e., $d = n - k + 1$.

There are a variety of existing techniques for performing error and erasure decoding. Forney's approach (described in G. D. Forney, Jr., "On decoding BCH codes," IEEE Transactions on Information Theory, October 1965) first removes erasure information from syndromes and then error-only decoding is performed. For example, during the first f iterations, erasure processing is performed and afterwards error correction is performed using Berlekamp-Massey. Blahut's approach (described in Blahut's book) is to treat error and erasure in a unified manner (i.e., a modified Berlekamp-Massey). However, Blahut's approach includes inversions, which is undesirable in some cases. Truong's approach (described in J. H. Jeng and T. K. Truong, "On decoding of both errors and erasures of a Reed-Solomon code using an inverse-free Berlekamp-Massey algorithm," IEEE Transactions on Communications, October 1999, hereinafter referred to as the Jeng et al. paper) uses the extended Euclidean algorithm to update the error evaluator polynomial, and simultaneously, the inversionless Blahut error and erasure process to update the error locator polynomial. Truong's approach avoids the explicit computation of discrepancy and iteratively computes both polynomials in parallel.

What is disclosed is a process related to error and erasure decoding. In some embodiments, this process is performed in an inversionless and unified manner. In some embodiments, an associated systolic architecture is based on or is otherwise related to the systolic architecture of D. V. Sarwate and N. R. Shanbhag, "High-speed architectures for Reed-Solomon decoders," IEEE Transactions on VLSI Systems, October 2001 (hereinafter referred to as the Sarwate et al. paper), which is for error-only decoding. In some embodiments, an error and erasure process and/or related systolic architecture is based on the inversionless Blahut error and erasure decoding process described in the Trung et al. paper.

In some embodiments, a systolic architecture uses 8t+2 multipliers and has a critical path delay of one multiplier, one adder, and one multiplexer. In some cases, this is a faster critical path compared to some other architectures. For example, a straightforward (serial) implementation of the architecture described in the Jeng et al. paper uses 6t+6 multipliers and has a critical path delay of two multipliers, $2+\lceil \log_2 t \rceil$ adders, and one multiplexer. In some embodiments, the disclosed error and erasure process generates the complement of an error evaluator polynomial, instead of an error locator polynomial itself. For example, in T. K. Truong, J. H. Jeng and K. C. Hung, "Decoding method for correcting both erasures and errors of Reed-Solomon codes," U.S. Pat. No. 6,449,746 (hereinafter referred to as the Truong et al. patent) an error locator polynomial rather than its complement is output.

For a Reed-Solomon C(n,k) code over $GF(2^m)$, a k-symbol dataword $D \triangleq [D_{k-1}, D_{k-2}, \ldots, D_1, D_0]$ is encoded into an n-symbol codeword $C \triangleq [C_{n-1}, C_{n-2}, \ldots, C_1, C_0]$, or more conveniently, a dataword polynomial $D(x)=D_{k-1}x^{k-1}+D_{k-2}x^{k-2}+\ldots+D_1x^1+D_0$ is encoded to a codeword polynomial $C(x)=C_{n-1}x^{n-1}+C_{n-2}x^{n-2}+\ldots+C_1x^1+C_0$, by means of a generator polynomial $$G(x) \triangleq \prod_{i=1}^{n-k} (x - \alpha^i),$$

where $\alpha$ is a primitive element of $GF(2^m)$. As used herein, there is no difference between a vector $A \triangleq [A_0, A_1, A_2, \ldots, A_l]$ and its polynomial representation $A(x)=A_0+A_1x^1+A_2x^2+\ldots+A_lx^l$. A polynomial of degree less than n is a codeword polynomial if and only if it is divisible by the generator polynomial G(x). A codeword polynomial C(x) satisfies $$C(\alpha^i)=0, i=1, 2, \ldots, n-k.$$

The minimum Hamming distance of the code is $d_{min}=n-k+1$, a feature known as maximally-distance-separable. For convenience, let n−k=2t, where t is known as the error-correction capability.

In some embodiments, a systematic code is used. A systematic encoding generates a codeword that comprises of the dataword followed by parity-check symbols. This may be obtained as follows. Let $\Psi(x) \triangleq \Psi_{2t-1}x^{2t-1}+\Psi_{2t-2}x^{2t-2}+\ldots+\Psi_1x+\Psi_0$ denote the remainder of $x^{2t}D(x)$ divided by G(x). Then, the polynomial $x^{2t}D(x)-\Psi(x)$ contains the factor G(x) and is denoted as a systematic codeword polynomial. Alternatively, $C=[D_{k-1}, D_{k-2}, \ldots, D_0, -\Psi_{2t-1}, -\Psi_{2t-2}, \ldots, \Psi_0]$.

FIG. 1 is a diagram illustrating an embodiment of a decoder configured to process Reed-Solomon encoded data. In the example shown, decoder 100 is an error and erasure decoder. Let C(x) denote the transmitted codeword polynomial and R(x) the received word polynomial after appropriate channel quantization. The decoding objective is to determine the error polynomial E(x) such that C(x)=R(x)−E(x). Syndrome generator 101 has R(x) as an input and S(x) as an output, where:

$$S_i = R(\alpha^{i+1}) = C(\alpha^{i+1}) + E(\alpha^{i+1}) = E(\alpha^{i+1}), i=0, 1, 2, \ldots, 2t-1.$$

If all 2t syndrome values are zero, then R(x) is a codeword and thus is presumed that C(x)=R(x), i.e., no errors have occurred. Otherwise, the decoder attempts to solve the following equation system $$\begin{cases} Y_1 X_1^1 + Y_2 X_2^1 + \ldots + Y_e X_e^1 = S_0 \\ Y_1 X_1^2 + Y_2 X_2^2 + \ldots + Y_e X_e^2 = S_1 \\ \vdots \\ Y_1 X_1^{2t} + Y_2 X_2^{2t} + \ldots + Y_e X_e^{2t} = S_{2t-1} \end{cases}$$

where e denotes the (unknown) number of errors, $X_1, X_2, \ldots, X_e$ denote the error locations, and $Y_1, Y_2, \ldots, Y_e$ denote the corresponding error magnitudes.

The syndrome polynomial is defined to be:

$$S(x) \triangleq S_0 + S_1 x + S_2 x^2 + \ldots + S_{2t-1} x^{2t-1} \quad (1)$$

The error locator polynomial is defined to be:

$$\Lambda(x) \triangleq \prod_{i=1}^{e} (1 - X_i x) = 1 + \Lambda_1 x + \Lambda_2 x^2 + \ldots + \Lambda_e x^e \quad (2)$$

The error evaluator polynomial is defined to be:

$$\Omega(x) \triangleq \sum_{i=1}^{e} Y_i X_i \prod_{j=1, j \neq i}^{e} (1 - X_j x) = \Omega_0 + \Omega_1 x + \Omega_2 x^2 + \ldots + \Omega_{e-1} x^{e-1}.$$

(3)

The three polynomials satisfy the following key equation:

$$\Omega(x) = \Lambda(x)S(x) \pmod{x^{2t}}. \quad (4)$$

Assume there are ρ erasures with locations at $\alpha_0, \alpha_1, \alpha_2, \ldots, \alpha_{\rho-1}$, respectively. Error-and-erasure decoding succeeds if the number of errors, denoted by f, and the number of erasures ρ, satisfies:

$$2f + \rho \leq 2t.$$

In some embodiments, an erasure is a symbol or other piece of data that is known to be wrong. In some embodiments, an erasure is a symbol or other piece of data that is lost or for which no information is received (e.g., via a wireless channel). In one example, if data is read back from a storage device (e.g., a disk drive), dust or other particulates may cause erasures. In some embodiments, the value or data (if any) for an erasure is not used.

In other systems where errors and erasures are processed in a unified fashion, great hardware amenity results (e.g., more regularity and/or less control logic). An example of pseudo code for the Inversionless Blahut Error and Erasure process (IBEE) described in the Jeng et al. paper is given below.

Inversionless Blahut Error-and-Erasure (IBEE)
• Input: $S = [S_0, S_1, S_2, \ldots, S_{2t-1}]$
• Initialization: $\Lambda^{(0)}(x) = 1, B^{(0)}(x) = 1, \gamma^{(0)} = 1$, and $L = 0$
• For r = 0,1,2,..., ρ − 1, do:
  - Compute $\Lambda^{(r+1)}(x) = (1 - \alpha_r x)\Lambda^{(r)}(x)$
  - Set $B^{(r+1)}(x) \leftarrow \Lambda^{(r)}(x), \gamma^{(r+1)} \leftarrow \gamma^{(r)}$, and $L \leftarrow L + 1$
  endfor
• For r = ρ, ρ + 1, ρ + 2,..., 2t − 1, do:
  - Compute $\Delta^{(r)} = \sum_{i=0}^{L} \Lambda_i^{(r)} \cdot S_{r-i}$ -continued

```
- Compute Λ^(r+1)(x) = γ^(r) · Λ^(r)(x) − Δ^(r) · xB^(r)(x)
- If Δ^(r) ≠ 0 and 2L ≤ r, then
    * Set B^(r+1)(x) ← Λ^(r)(x) and L ← r + 1 − L
    * Set γ^(r+1) ← Δ^(r)
- Else
    * Set B^(r+1)(x) ← xB^(r)(x)
    * Set γ^(r+1) ← γ^(r)
  endif
endfor
• Compute Ω^(2t)(x) = Λ^(2t)(x)S(x)  (mod x^(2t))
• Output: Λ^(2t)(x), Ω^(2t)(x), L
```

Note that in the above description, the superscript "$(r)$" is used to indicate the r-th iteration and the subscript "$_i$" the i-th coefficient.

The above IBEE is transformed to the following, more homogeneous process:

Revised Inversionless Blahut Error and Erasure (rIBEE)

```
• Input: S = [S_0, S_1, S_2,..., S_{2t−1}]
• Initialization: Λ^(0)(x) = 1, B^(0)(x) = 1, γ^(0) = 1, and L_B = L_Λ = 0
• For r = 0,1,2,..., ρ − 1, do:
    - If r < ρ, then set Δ^(r) = α_r, else compute
      Δ^(r) = Σ_{i=0}^{L_Λ} Λ_i^(r) · S_{r−i}
    - Compute Λ^(r+1)(x) = γ^(r) · Λ^(r)(x) − Δ^(r) · xB^(r)(x)
    - If r < ρ, or, Δ^(r) ≠ 0 and 2L_Λ ≤ r
        * Set B^(r+1)(x) ← Λ^(r)(x)
        * Set L_Λ ← L_B + 1, L_B ← L_Λ
    - Else
        * Set B^(r+1)(x) ← xB^(r)(x)
        * Set L_B ← L_B + 1, L_Λ ← L_Λ
      endif
    - If r ≥ ρ, and Δ^(r) ≠ 0, and 2L_Λ ≤ r
        * Set γ^(r+1) ← Δ^(r)
    - Else
        * Set γ^(r+1) ← γ^(r)
      endif
  endfor
• Compute Ω^(2t)(x) = Λ^(2t)(x)S(x)  (mod x^(2t))
• Output: Λ^(2t)(x), Ω^(2t)(x), L_Λ
```

In some applications, it would be desirable to improve the latency of the rIBEE. For example, after the for loop but prior to outputting its values, the rIBEE has a computation step that must be performed. It would be desirable if this step could be avoided so that the latency is cut by half. In some applications it is desirable to shorten the critical path delay, particularly to remove the delay due to the discrepancy computation.

A left-shift operator "$\mathscr{L}$" of a polynomial is defined such that $$[\mathscr{L}_r A](x) \triangleq [A(x) - (A(x) \bmod x^r)]/x^r \quad (5)$$

An alternative interpretation gives more insight. Let $A = [A_0, A_1, A_2, \ldots, A_l]$ be the vector representation of the polynomial $A(x)$ and $\mathscr{L}_r A = [A_r, A_{r+1}, A_{r+2}, \ldots, A_l]$.

In the Sarwate et al. paper, a systolic architecture for error-only decoding is presented. Through simultaneous update of the complement of an error evaluator polynomial and an error locator polynomial, the discrepancy values are always readily available from the (same) first location and thus the critical path delay is significantly shorted by avoiding computation of the discrepancy value in the critical path. In the embodiment discussed below, this parallel mechanism is applied to error and erasure decoding using the rIBEE. The proof of correctness follows the analysis in the Sarwate et al. paper in light of the rIBEE.

Referring back to the embodiment shown in FIG. 1, Parallel Inversionless Blahut Error and Erasure Processor 102 in some embodiments performs the following process:

Parallel Inversionless Blahut Error and Erasure (PIBEE)

```
• Input: S = [S_0, S_1, S_2,..., S_{2t−1}]
• Set = Ω̂^(0)(x) = Θ̂^(0)(x) = S_0 + S_1 x + ... + S_{2t−1} x^{2t−1} + x^{4t}, γ^(0) = 1,
  L_B = L_Λ = 0
• For r = 0,1,2,...,2t − 1, do:
    - Set Δ = α_r if r < ρ, otherwise Δ = Ω̂_0^(r)
    - Ω̂^(r+1)(x) = γ^(r) · [𝓛_1 Ω̂^(r)](x) − Δ · Θ̂^(r)(x)
    - If r < ρ, or, Ω̂_0^(r) ≠ 0 and 2L_Λ ≤ r
        * Set Θ̂^(r+1)(x) ← [𝓛_1 Ω̂^(r)](x)
        * Set L_Λ ← L_B + 1, L_B ← L_Λ
    - Else
        * Set Θ̂^(r+1)(x) ← Θ̂^(r)(x)
        * Set L_B ← L_B + 1, L_Λ ← L_Λ
      endif
    - If r ≥ ρ, and Ω̂_0^(r) ≠ 0, and 2L_Λ ≤ r
        * Set γ^(r+1) ← Ω̂_0^(r)
    - Else
        * Set γ^(r+1) ← γ^(r)
      endif
  endfor
• Output: Ω̂ = [Ω̂_0^(2t), Ω̂_1^(2t), Ω̂_2^(2t),..., Ω̂_{2t−1}^(2t)], L_Λ
  Λ = [Ω̂_{2t}^(2t), Ω̂_{2t+1}^(2t), Ω̂_{2t+2}^(2t),..., Ω̂_{4t}^(2t)]
```

Note that $\hat{\Omega}^{(r)}(x)$ and $\hat{\Theta}^{(r)}(x)$ is a left-shifted polynomial of $\Lambda^{(r)}(x)S(x)$ and $B^{(r)}(x)S(x)$ respectively, more specifically, $$\hat{\Omega}^{(r)}(x) = [\mathscr{L}_r(\Lambda^{(r)}S)](x),$$

$$\hat{\Theta}^{(r)}(x) = [\mathscr{L}_r(B^{(r)}S)](x),$$

where $\Lambda^{(r)}(x)$ and $B^{(r)}(x)$ denote the error locator polynomial couple generated during the r-th iteration of the rIBEEA.

$\hat{\Omega}(x)$, which is output by the PIBEEA, is referred to as the complementary error evaluator polynomial since it is the complement of the error evaluator polynomial $\Omega(x)$, i.e., $\hat{\Omega}(x) x^{2t} + \Omega(x) = \Lambda(x)S(x)$.

Proposition (i). The error locator polynomial $\Lambda(x)$ obtained from the PIBEE is identical to the one obtained through the original rIBEE.

(ii). Let $\Omega(x)$ be the error evaluator polynomial as defined in (4), then $$\Omega(x) + x^{2t} \cdot \hat{\Omega}(x) = \Lambda(x)S(x) \quad (6)$$

Proof: The following equality can be shown by induction $$\hat{\Omega}^{(r)}(x) = [\mathscr{L}_r(\Lambda^{(r)}S)](x)$$

where $\hat{\Omega}^{(r)}(x)$ is obtained from the first 2t registers at the r-th iteration, whereas $\Lambda^{(r)}(x)$ is obtained from the rIBEE at r-th iteration. Consequently, $$\hat{\Omega}_0^{(r)} = \Delta_r, \; r \geq \rho.$$

Thus, (i) and (ii) follow.

Let $X^{-1}$ be a root of $\Lambda(x)$, then (6) is reduced to $$\Omega(X^{-1}) = X^{-2t} \hat{\Omega}(X^{-1}).$$

Thus, error magnitudes are computed through a modified Forney formula as follows:

$$Y_i = \frac{\Omega(X_i^{-1})}{\Lambda_{odd}(X_i^{-1})} = \frac{X_i^{-2t} \hat{\Omega}(X_i^{-1})}{\Lambda_{odd}(X_i^{-1})}. \quad (7)$$

where $X_i^{-1}$ is a root of $\Lambda(x)$.

That is, the original Forney equation $$Y_i = \frac{\Omega(X_i^{-1})}{\Lambda_{odd}(X_i^{-1})}$$

is modified to accommodate $\hat{\Omega}(x)$ which is output by the PIBEE, thus producing the modified Forney equation $$Y_i = \frac{X_i^{-2t}\hat{\Omega}(X_i^{-1})}{\Lambda_{odd}(X_i^{-1})}.$$

In some embodiments, the modified Forney equation does not necessarily add delay and/or complexity (e.g., when implemented in hardware) compared to the original Forney equation.

Referring back to the embodiment shown in FIG. 1, modified Forney processor 104 receives inputs $\hat{\Omega}(x)$ and $\Lambda(x)$, and outputs $(X_i, Y_i)$; in some embodiments, the example modified Forney equation given above is performed by processor 106.

There are a variety of differences between the approach described in the Truong et al. patent and the embodiments described herein. In the Truong et al. patent, the error evaluator polynomial (including the discrepancy values) and the error locator polynomial are computed simultaneously based on the combination of the IBEE and the Euclidean algorithm. With respect to some embodiments described herein, some example differences are:

1) The two techniques employ different initialization values: $\hat{\Theta}(x)=S(x)+x^{4t}$ in the PIBEE, in contrast to $\Theta(x)=0$ in the algorithm in the Truong et al. patent.

2) In some embodiments, what is output is a complementary error evaluator polynomial at the same starting location (e.g., within an array of registers or other processing units) whereas the architecture in the Truong et al. patent produces an error evaluator polynomial at a dynamic or otherwise varying starting location. In some cases (e.g., parallel loading), this makes the techniques described herein attractive because additional decision making (e.g., to determine at what starting location a value is output) is not required.

3) The proposed architecture exhibits simpler control unit design. If not carefully designed this may well become a critical path delay. Table 1 lists an example comparing the number of components and critical path delays.

TABLE 1

Comparison of Hardware Complexity and Path Delays

| | Adders | Multipliers | Latches | Muxes | Clocks | $T_{crit\text{-}path}$ |
|---|---|---|---|---|---|---|
| rIBEE | 4t | 6t + 2 | 4t + 2 | 2t + 1 | 4t | $2T_{mult} +$ $[\log_2(4t)]T_{add} + T_{mux}$ |
| PIBEE | 4t + 1 | 8t + 2 | 8t + 2 | 4t + 1 | 2t | $T_{mult} + T_{add} + T_{mux}$ |
| Truong et. al patent | 4t + 2 | 8t + 4 | 8t + 4 | 4t + 2 | 2t | $T_{mult} + T_{add} + T_{mux}$ |

Figure 2:
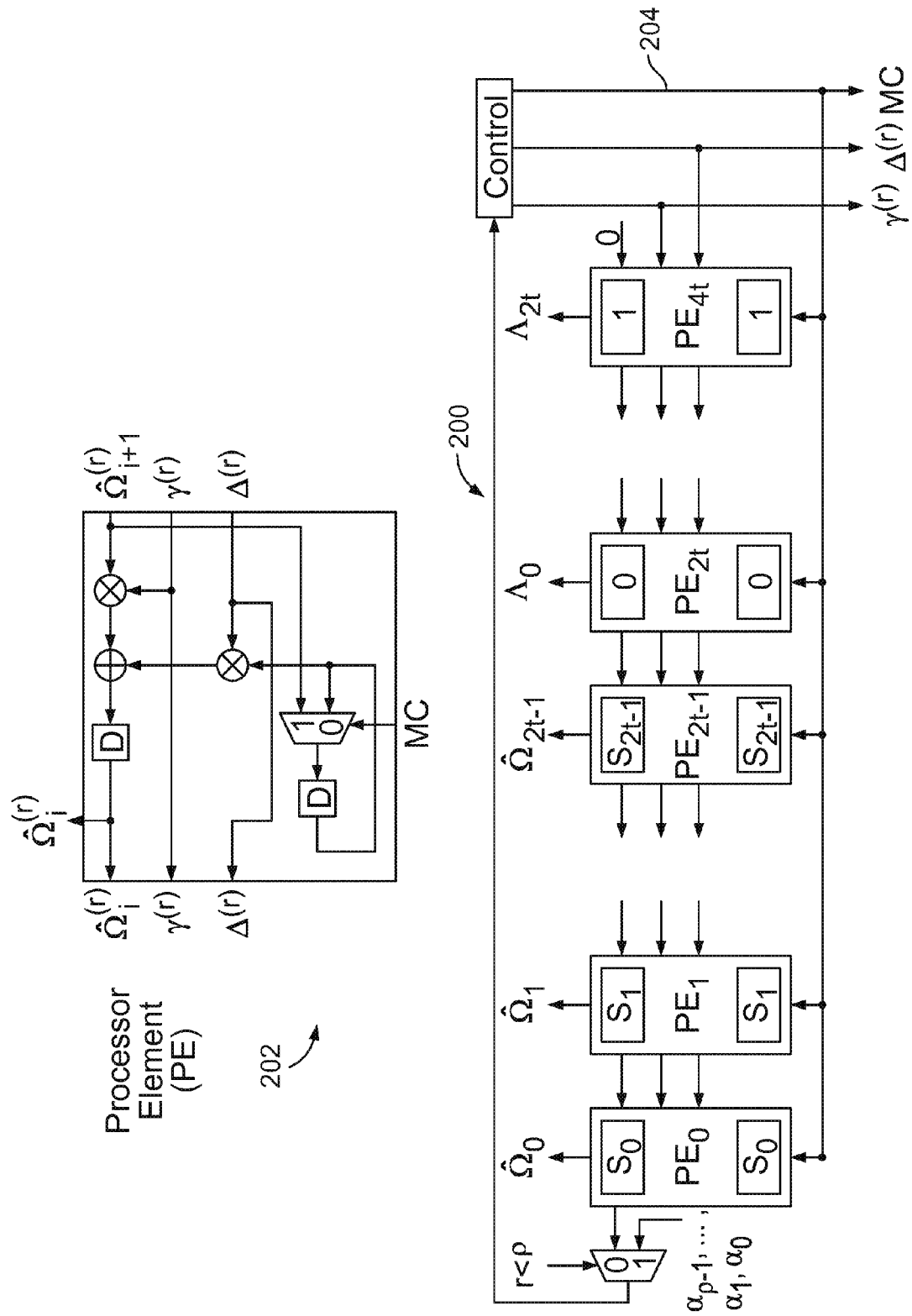
FIG. 2 shows an embodiment of a hardware implementation of a parallel inversionless Blahut error and erasure processor.

FIG. 2 shows an embodiment of a hardware implementation of a parallel inversionless Blahut error and erasure processor. In the example shown, PIBEE 200 has a systolic architecture. In some embodiments, component 102 in FIG. 1 is implemented using PIBEE 200.

PIBEE 200 contains an array of 4t+1 homogeneous systolic processor elements (PE). PE 202 shows one embodiment of such a processor element. The control signal MC (204) represents the Boolean value "r<ρ, or, $\hat{\Omega}_0^{(r)} \neq 0$ and $2L \leq r$". Ignoring the control unit (which may be of negligible complexity), PIBEE 200 uses 4t+1 adders, 8t+2 multipliers, 8t+2 registers, and 4t+1 multiplexers. The critical path delay is caused by the update of $\hat{\Omega}(x)$, which passes through one multiplier, one adder, and one multiplexer, namely, $$T_{crit\text{-}path} = T_{mult} + T_{add} + T_{mux}. \tag{8}$$

The techniques disclosed herein may be used in a wide variety of applications. For example, Reed-Solomon encoding is used in disk drives for storage applications. In some embodiments, the error and erasure processing techniques described herein are applied to data that is read back from a disk drive or other storage device. Reed-Solomon encoding may be used to exchange information from a transmitter to a receiver, for example over a wired or wireless channel. In some embodiments, the error and erasure related processing techniques described herein are used at a receiver on data received over a communication channel.

Although the foregoing embodiments have been described in some detail for purposes of clarity of understanding, the invention is not limited to the details provided. There are many alternative ways of implementing the invention. The disclosed embodiments are illustrative but not restrictive.

What is claimed is:

1. A method for generating a complementary error evaluator polynomial, comprising:
   obtaining a syndrome polynomial;
   obtaining one or more erasure locations, wherein the syndrome polynomial and the erasure locations are associated with Reed-Solomon encoded information; and
   using a processor to simultaneously generate a complementary error evaluator polynomial, which is a complement of the error evaluator polynomial, and an error locator polynomial using the syndrome polynomial and the erasure locations.

2. The method recited in claim 1, wherein simultaneously generating is performed in an inversionless manner.

3. The method recited in claim 1 further comprising determining one or more error locations using the complementary error evaluator polynomial and the error locator polynomial.

4. The method recited in claim 1 further comprising:
   obtaining read data from a disk storage system; and
   generating the syndrome polynomial based at least in part on the read data.

5. The method recited in claim 1, wherein simultaneously generating includes iteratively generating the complementary error evaluator polynomial using an initial value of the complementary error evaluator polynomial, wherein the initial value of the complementary error evaluator polynomial is set to $S(x)+x^{4t}$.

6. The method recited in claim 1, wherein simultaneously generating includes using an array of processing elements and the complementary error evaluator polynomial is generated at a constant offset within the array of processing elements.

7. The method recited in claim 1, wherein simultaneously generating includes using a first array of processing elements to generate the complementary error evaluator polynomial and using a second array of processing elements to generate the error locator polynomial, wherein all of the processing elements in the first array and all of the processing elements in the second array are the same processing element.

8. The method recited in claim 1, wherein simultaneously generating includes using a first array of processing elements to generate the complementary error evaluator polynomial and using a second array of processing elements to generate the error locator polynomial, wherein a first edge processing element within the first array is connected to a second edge processing element within the second array.

9. A system for generating a complementary error evaluator polynomial, comprising:
   an interface configured to:
   obtain a syndrome polynomial; and obtain one or more erasure locations, wherein the syndrome polynomial and the erasure locations are associated with Reed-Solomon encoded information;
a first array of processing elements configured to generate an complementary error evaluator polynomial which is a complement of a error evaluator polynomial; and
a second array of processing elements configured to generate the error locator polynomial, wherein the first array and the second array are configured to simultaneously generate the complementary error evaluator polynomial and the error locator polynomial using the syndrome polynomial and the erasure locations.

10. The system recited in claim 9, wherein the first array and the second array are configured to simultaneously generate in an inversionless manner.

11. The system recited in claim 9 further comprising a processor configured to determine one or more error locations using the complementary error evaluator polynomial and the error locator polynomial.

12. The system recited in claim 9, wherein:
a disk storage system interface configured to obtain read data from a disk storage system; and
a processor configured to generate the syndrome polynomial based at least in part on the read data.

13. The system recited in claim 9, wherein the first array is configured to iteratively generate the complementary error evaluator polynomial using an initial value of the complementary error evaluator polynomial, wherein the initial value of the complementary error evaluator polynomial is set to $S(x)+x^{4r}$.

14. The system recited in claim 9, wherein the first array is configured to generate the complementary error evaluator polynomial at a constant offset within the first array of processing elements.

15. The system recited in claim 9, wherein all of the processing elements in the first array and all of the processing elements in the second array are the same processing element.

16. The system recited in claim 9, wherein a first edge processing element within the first array is connected to a second edge processing element within the second array.

17. A computer program product for generating a complementary error evaluator polynomial, the computer program product being embodied in non-transitory computer readable storage medium and comprising computer instructions for:
obtaining a syndrome polynomial;
obtaining one or more erasure locations, wherein the syndrome polynomial and the erasure locations are associated with Reed-Solomon encoded information; and
simultaneously generating a complementary error evaluator polynomial, which is a complement of the error evaluator polynomial, and an error locator polynomial using the syndrome polynomial and the erasure locations.

18. The computer program product recited in claim 17, wherein simultaneously generating is performed in an inversionless manner.

19. The computer program product recited in claim 17 further comprising computer instructions for determining one or more error locations using the complementary error evaluator polynomial and the error locator polynomial.

20. The computer program product recited in claim 17 further comprising computer instructions for:
obtaining read data from a disk storage system; and
generating the syndrome polynomial based at least in part on the read data.

21. The computer program product recited in claim 17, wherein simultaneously generating includes iteratively generating the complementary error evaluator polynomial using an initial value of the complementary error evaluator polynomial, wherein the initial value of the complementary error evaluator polynomial is set to $S(x)+x^{4r}$.

* * * * *

UNITED STATES PATENT AND TRADEMARK OFFICE
CERTIFICATE OF CORRECTION

PATENT NO. : 8,347,193 B2
APPLICATION NO. : 12/960094
DATED : January 1, 2013
INVENTOR(S) : Yingquan Wu Page 1 of 1

It is certified that error appears in the above-identified patent and that said Letters Patent is hereby corrected as shown below:

Title Page

Related U.S. Application Data

(63) delete "Pat. No. 7,780,469" replace with --Pat. No. 7,870,469--

Signed and Sealed this
Fourth Day of June, 2013

Teresa Stanek Rea
*Acting Director of the United States Patent and Trademark Office*